United States Patent [19]

Wood et al.

[11] 4,013,982

[45] Mar. 22, 1977

[54] PIEZOELECTRIC CRYSTAL UNIT

[75] Inventors: Alan F. B. Wood; Graham Rogers; Edward G. Tuckett, all of Harlow, England

[73] Assignee: International Standard Electric Corporation, New York, N.Y.

[22] Filed: Sept. 4, 1975

[21] Appl. No.: 610,343

[30] Foreign Application Priority Data

Oct. 22, 1974 United Kingdom ............. 45609/74

[52] U.S. Cl. .................................. 333/72; 310/8.2; 310/9.8
[51] Int. Cl.² ..................... H03H 9/20; H03H 9/04; H03H 9/32; H03H 9/24
[58] Field of Search ............... 333/30 R, 72; 310/8, 310/8.2, 9.8, 8.3, 9.7

[56] References Cited
UNITED STATES PATENTS

| | | | |
|---|---|---|---|
| 2,963,597 | 12/1960 | Gerber | 310/8.2 |
| 3,416,036 | 12/1968 | Ho | 333/72 X |
| 3,624,431 | 11/1971 | Machida et al. | 333/72 X |
| 3,659,123 | 4/1972 | Oya | 310/8 |
| 3,676,724 | 7/1972 | Berlincourt | 333/72 X |
| 3,727,154 | 4/1973 | Dailing et al. | 333/72 |
| 3,838,366 | 9/1974 | Coussot | 333/72 |

*Primary Examiner*—Alfred E. Smith
*Assistant Examiner*—Marvin Nussbaum
*Attorney, Agent, or Firm*—John T. O'Halloran

[57] ABSTRACT

A piezoelectric monolithic crystal filter having shunt trimming capacitors incorporated into the design of the filter as electrode strips at the edges of the crystal element. This eliminates the need to use discrete low value shunt trimming capacitors which generally are of a few pico-farad capacitance and are expensive and introduce objectionable lead inductance which is non-linear with frequency. A means is provided for producing filters which are less expensive and improve performance over conventional filters, particularly at higher frequencies.

2 Claims, 10 Drawing Figures

PIEZOELECTRIC CRYSTAL UNIT

This invention relates to piezoelectric crystal units.

The utilisation of such units in for example electric filter networks requires a number of additional circuit components such as capacitors to be associated therewith.

An object of this invention is to reduce the number of components required for example in a filter using coupled-mode piezoelectric crystal vibrators (or monolithic crystals as they will be called hereafter), thereby saving cost and space and improving reliability through the reduction in the number of soldered connections. A further object is to obtain capacitance values and tolerances which are difficult to achieve with conventional capacitors.

According to the invention there is provided a piezoelectric crystal unit comprising a piezoelectric crystal element having on opposite faces thereof an electrode pattern with at least one of said patterns being extended to form part of an associated additional circuit component.

Figure 1:
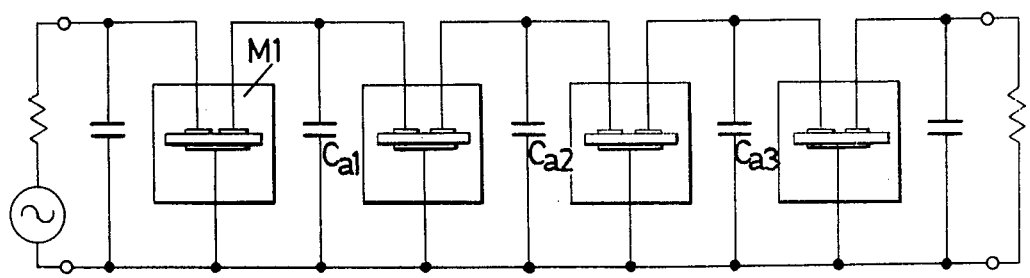
Figure 2A:
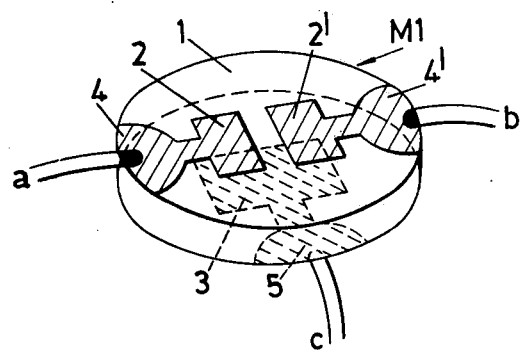
Figure 2B:
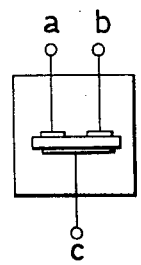
Figure 2C:
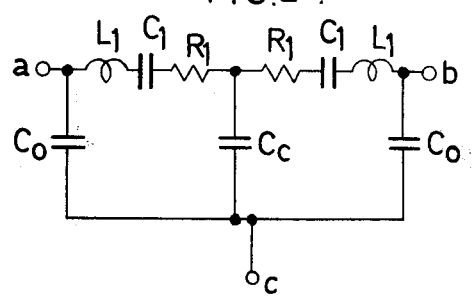
Figure 3:
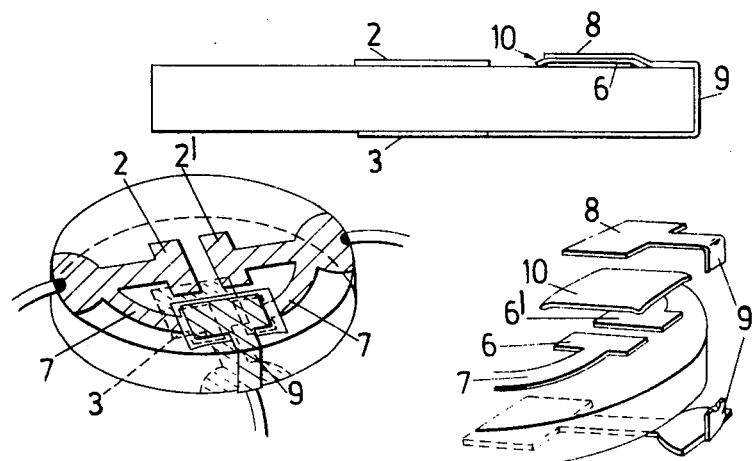
Figure 4:
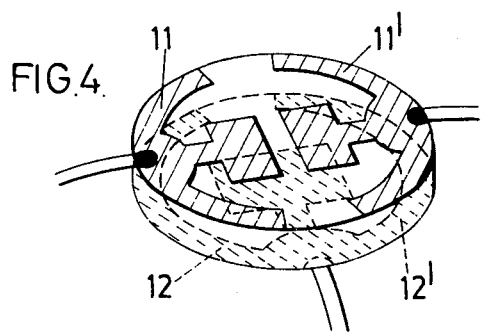
Figure 5:
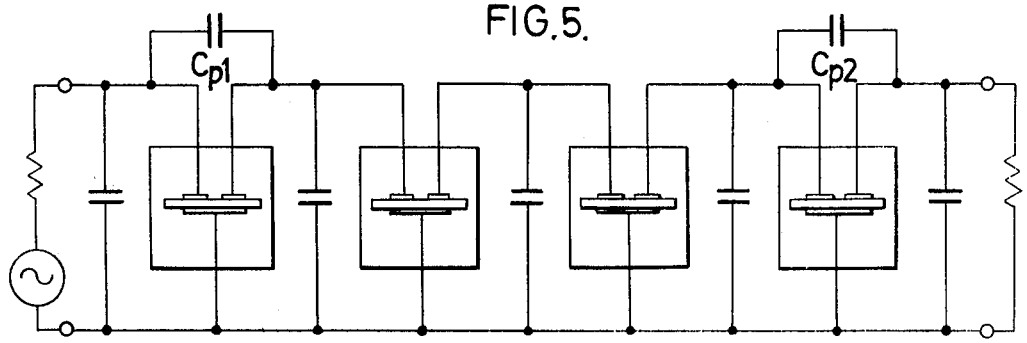
Figure 6:
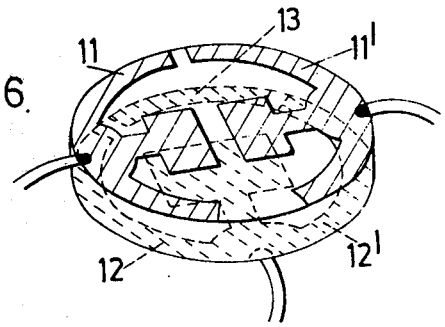
Figure 7:
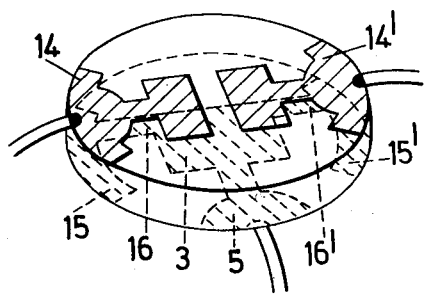
Figure 8:
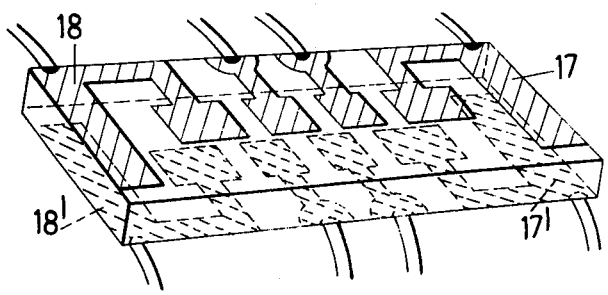

The invention will be more clearly understood from the following description in conjunction with the accompanying drawings, in which FIG. 1 shows a typical bandpass filter circuit using dual-resonator monolithic crystals, FIG. 2a shows the physical structure of the monolithic crystal and how it relates to the circuit symbol of FIG. 2b, FIG. 2c shows the equivalent electrical circuit of the monolithic crystal, FIG. 3 shows a monolithic crystal in accordance with a first embodiment of the invention, FIG. 4 shows a monolithic crystal in accordance with a second embodiment of the invention, FIG. 5 shows a multiple resonator arrangement with a capacitance connected between input and output of one or more resonators, FIGS. 6 and 7 show respectively a monolithic crystal in accordance with a third and a fourth embodiment of the invention, and FIG. 8 shows a multiple resonator arrangement in accordance with a fifth embodiment of the invention.

The crystal unit M1, FIGS. 1, 2 and 3, comprises a disc shaped crystal element 1 with spaced electrodes 2, 2' on the upper surface connected respectively to terminal areas 4, 4', and a common electrode 3 on the lower surface connected to terminal area 5. Lead wires $a$, $b$ and $c$ are soldered respectively to the terminals 4, 4' and 5.

The value of the total shunt capacitance, $C_{J1}$ etc., at each junction between monolithic crystals is related to the dynamic capacitance $C_1$ of the equivalent circuit of FIG. 2c. The shunt capacitance is made up of the capacitance $C_{a1}$ of the capacitor actually fitted (including its stray wiring capacitances) together with the contributions from the shunt electrode capacitance of the two monolithic crystals on either side of the junction. Assuming for the present that all monolithics are equal and symmetrical then $C_{J1} = C_{a1} + 2C_o$ etc.

For a particular shape of the filter characteristic the value of any junction capacitance is given by $$C_{Jn} = f_o\, K_n\, C_1/BW$$

where $f_o$ is the centre frequency, $K_n$ a constant and $BW$ the filter bandwidth.

For example, $K_n$ is of the order of 2 for a 0.5 dB ripple Chebyshef filter. Thus the shunt capacitance $C_o$ between the resonator electrodes sets an upper limit to the bandwidth that may be attained using the circuit of FIG. 1. At this limiting bandwidth the shunt capacitance $2C_o$ is equal to $C_{Jn}$ so that no extra capacitor has to be connected at the junction. In practice this applies approximately at all the junctions and the filter assumes a very simple practical configuration.

The limiting bandwidth can be exceeded by connecting inductors between junctions and ground to tune out excess capacitance. For practical AT-cut quartz crystals in metal cans the ratio of $C_o/C_1$ in FIG. 2c is about 300 and this sets an upper limit of about 35 kHz bandwidth at 10.7 MHz centre frequency, for the Chebyshef filter already mentioned. Most mobile radio filters have a narrower bandwidth than this and a small capacitor is fitted at each junction.

If the shunt capacitance $C_o$ is increased sufficiently, without altering $C_1$, then it is possible to make a filter without any shunt capacitors, similar to the filter with the limiting bandwidth mentioned above. One way of doing this is to use the piezoelectric element as a substrate for thin film capacitors and deposit a sandwich of metal-dielectric-metal away from the resonator area and suitably connected to the resonator electrodes. As shown in FIG. 3, electrodes 6, 6' are connected to the resonator electrodes 2, 2' by connecting strips 7, 7'. Electrode 8 is connected to common resonator electrode 3 via a connecting strip 9. Electrodes 6 and 8 in conjunction with dielectric layer 10 form an extra shunt capacitor across one resonator and electrodes 6' and 8 form a similar shunt capacitor across the other resonator. As shown in FIG. 3, electrode 8 overlies electrodes 6 and 6' but it will be clear that alternatively electrodes 6 and 6' could overlie electrode 8.

It is also possible to use the piezoelectric element itself as the dielectric and to deposit further electrodes on either side as in FIG. 4. Electrodes 11 and 12 form a capacitor in shunt with the left-hand resonator and 11' and 12' form a capacitor in shunt with the right-hand resonator.

These extra electrode regions define further piezoelectrically coupled resonators which could drastically affect the filter characteristic. However, in practice it has been found that this need not happen for the following reasons:

1. Unless the thickness of electrode plating on the extra 'resonators' is critically adjusted, taking account of their different size and shape, their frequencies will be far removed from the passband.

2. The extra 'resonators' are far apart and the coupling between them, and between them and the active resonators, is very small. Thus any potential deviation from the desired filter response is very small.

3. The extra 'resonators' are on the extreme edge of the piezoelectric element and therefore have very low Q. This further reduces any deviations.

The net result of these considerations is that the extra electrodes introduce very small deviations from the desired filter response and these are well away from the passband. In fact, it has not been found possible to identify deviations due to the extra electrodes until so much material has been added to them that their resonance frequencies are well below that of the active resonators. In practice, where only a small thickness of plating is used, the extra electrodes have a beneficial effect in slightly reducing the Q of the unwanted resonances normally observed above the passband frequency. It is already known that the Q of unwanted resonances can be reduced by applying extra films of material around the periphery of the element. In this case, as in the case of the present invention, the Q of the wanted resonance is also somewhat reduced.

It is possible to replace other capacitors in the filter circuit using the technique described here. For example, a capacitance $C_p$ is sometimes connected from input to output of one or more resonators, as in FIG. 5, to give attenuation peaks. This effect may be achieved by adding electrode 13 as in FIG. 6. Where electrode 13 overlaps electrodes 11 and 11' it forms two further capacitors which are effectively connected in series between input and output of the monolithic crystal. The value of the capacitance $C_p$ may be much less than 1pF; this raises problems in finding a practical capacitor of suitable tolerance. It is extremely simple to form a capacitor of this value using the present invention.

There is a practical limit to the amount of capacitance that may be added by the technique described in the preceding paragraph, depending upon the element and active resonator dimensions. For capacitances above the limit the dielectric sandwich principle may be used.

In the above description, various electrode configurations have been shown by way of example but the technique is quite general and numerous other possibilities exist. FIG. 7 shows an alternative to FIG. 4 in which the added electrodes on the underside, 15 and 15', are connected to the resonator electrode 3 by connecting strips 16 and 16', rather than by connection to the mounting area 5.

The basic monolithic crystal to which the extra capacitances have been added may also be different in form. It need not be symmetrical, with equal resonator areas for input and output. The added electrode areas would generally be different too — to take account of different capacitances at the filter junctions and different stray capacitances due to the wiring layout. The basic monolithic configuration need not have a common electrode, as in FIG. 2a, but could have entirely separate electrodes on both sides.

Finally the invention is equally applicable to filters using monolithic crystals having three or more resonators on each element. In this case the intermediate resonators are generally short-circuited by suitable means (not shown), and capacitor electrodes 17, 17' and 18, 18' are added only to the end resonators as shown in FIG. 8.

It is to be understood that the foregoing description of specific examples of this invention is made by way of example only and is not to be considered as a limitation on its scope.

We claim:

1. A piezoelectric crystal unit comprising a piezoelectric crystal element having on opposite faces thereof an electrode pattern with at least one of said patterns being extended to the other face of the element where a portion of said extension is in juxtaposition with an extended portion of the other of said patterns with a dielectric layer between the two portions.

2. A piezoelectric crystal unit as described in claim 1 wherein at least one of said electrode patterns is extended to form a part of an additional circuit component.

* * * * *